US 6,695,297 B2

(12) United States Patent
Hoen et al.

(10) Patent No.: US 6,695,297 B2
(45) Date of Patent: Feb. 24, 2004

(54) FLEXURAL DEVICE-BASED SUSPENSION HAVING HIGH COMPLIANCE IN A DIRECTION OF TRAVEL AND LOW COMPLIANCE IN A DIRECTION ORTHOGONAL THERETO

(75) Inventors: Storrs T. Hoen, Brisbane, CA (US); Jonah A. Harley, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 50 days.

(21) Appl. No.: 10/039,937

(22) Filed: Dec. 19, 2001

(65) Prior Publication Data

US 2003/0116900 A1 Jun. 26, 2003

(51) Int. Cl.[7] .................................................. F16F 1/18
(52) U.S. Cl. ........................ 267/160; 267/158
(58) Field of Search .................................. 267/160, 162; 360/294.1, 294.6

(56) References Cited

U.S. PATENT DOCUMENTS 6,189,875 B1 * 2/2001 Van Gastel .................. 267/160

* cited by examiner

*Primary Examiner*—Christopher P. Schwartz
(74) *Attorney, Agent, or Firm*—Ian Hardcastle

(57) ABSTRACT

The flexural device-based suspension suspends a movable element with high compliance in a direction of travel and low compliance in a direction orthogonal to the direction of travel. The suspension comprises two flexural devices and a constraining element. The two flexural devices are connected to the movable element. Each of the flexural devices includes an elongate floating beam disposed substantially parallel to the direction of travel. The constraining element is for constraining relative motion of the floating beams in the direction of travel and for allowing the floating beams to move freely relative to one another in the orthogonal direction.

30 Claims, 9 Drawing Sheets

FLEXURAL DEVICE-BASED SUSPENSION HAVING HIGH COMPLIANCE IN A DIRECTION OF TRAVEL AND LOW COMPLIANCE IN A DIRECTION ORTHOGONAL THERETO

CROSS-REFERENCE TO RELATED APPLICATIONS

This application is related to copending U.S. patent application entitled Pivot-less Watt Linkage, Pivot-less Watt Linkage-Based Suspension and Micromachined Device Incorporating Same (Ser. No. 10/042,805) filed on the same date as this disclosure, the entire disclosure of which is incorporated herein by reference.

BACKGROUND OF THE INVENTION

Micromachined devices include devices, such as actuators and motors, in which a movable element is required to move substantially linearly with respect to another element. Such devices include a suspension that supports the movable element relative to the other element. Desirable properties of the suspension include that the suspension allow a broad range of substantially linear movement and that the suspension have a high compliance in the direction of travel of the movable element. A high compliance reduces the force that a motor needs to generate to move the movable element.

An electrostatic or electromagnetic motor used to move the movable element in its direction of travel not only generates a force in the direction of travel, but additionally generates parasitic forces in directions orthogonal to the direction of travel. More than minimal motion of the movable element in a direction orthogonal to the direction of travel is undesirable since it can result in physical contact between the movable element and the other element. Accordingly, another desirable property of the suspension is that it should be have a low compliance in at least one direction orthogonal to the direction of travel.

One form of suspension commonly used in micromachined devices is known as a flexural device. Flexural devices are based on elongate flexible beams. Such beams can have a cross-sectional shape with a highly-asymmetrical aspect ratio. Flexural devices incorporating such flexible beams inherently have a high compliance in the direction in which their cross section is narrow and inherently have a low compliance in the direction in which their cross-section is wide. Thus, flexural devices based on flexible beams having a narrow cross-section in the direction of travel, which will be called the x-direction, and having a wide cross-section in the z-direction orthogonal to the x-direction inherently have a high compliance in the direction of travel and inherently have a low compliance in the z-direction. Alternatively, in applications in which some motion in the z-direction is allowable, the flexible beams can be formed with a cross-sectional shape having a less asymmetrical, or even a symmetrical, aspect ratio.

In the y-direction, orthogonal to both the x- and z-directions, flexural devices based on elongate flexible beams have a low compliance when the flexible beams are straight, i.e., not bent. Typically, the flexible beams are straight in the rest position of the movable element. The y-direction compliance increases as the flexible beams bend lengthways with increasing displacement of the movable element in the x-direction from its rest position. This compliance vs. displacement characteristic is undesirable, as it limits the practical range of motion of the movable element in the x-direction. Motion beyond the point at which the y-direction compliance of the flexural device increases beyond a threshold related to the y-direction parasitic force can result in catastrophic run-away motion in the y-direction.

What is needed, therefore, is a flexural device-based suspension for micromachined devices that has a high compliance in a direction of travel of the movable element and a low compliance in at least one direction orthogonal to the direction of travel. The suspension should maintain its low compliance in the orthogonal direction over a substantial range of movement of the movable element in the direction of travel. What is also needed is a suspension having a structure capable of easily fabrication using conventional micromachining techniques.

SUMMARY OF THE INVENTION

The invention provides a flexural device-based suspension for suspending a movable element with high compliance in a direction of travel and low compliance in a direction orthogonal to the direction of travel. The suspension comprises two flexural devices and a constraining element. The two flexural devices are connected to the movable element. Each of the flexural devices includes an elongate floating beam disposed substantially parallel to the direction of travel. The constraining element is for constraining relative motion of the floating beams in the direction of travel and for allowing the floating beams to move freely relative to one another in the orthogonal direction.

When the movable element moves in the direction of travel, the floating beams move relative to one another in the orthogonal direction. Undesired motion of the movable element in the orthogonal direction causes the floating beams to move relative to one another in the direction of travel. Thus, by constraining relative motion of the floating beams in the direction of travel while allowing the floating beams to move freely relative to one another in the orthogonal direction, the constraining element resists undesired motion of the movable element in the orthogonal direction while allowing the movable element to move freely in the direction of travel.

The invention also provides a micromachined device that comprises a movable element, a first flexural device, a second flexural device and a constraining element. The first flexural device and the second flexural device are located on opposite sides of the movable element and permit movement of the movable element in a direction of travel. Each of the flexural devices includes an elongate floating beam substantially parallel to the direction of travel. The constraining element extends between the floating beams, and has a low compliance in the direction of travel and a high compliance in a direction orthogonal to the direction of travel.

The low compliance of the constraining element in the direction of travel resists relative motion of the floating beams in the direction of travel, while its high compliance in the orthogonal direction allows the floating beams to move freely relative to one another in the orthogonal direction. Thus, the constraining element resists undesired motion of the movable element in the orthogonal direction while allowing the movable element to move freely in the direction of travel.

Other features and advantages of the invention will be apparent upon examination of the following drawings and detailed description. It is intended that all such additional systems, methods, features, and advantages be included within this description, be within the scope of the invention, and be protected by the accompanying claims.

BRIEF DESCRIPTION OF THE DRAWINGS

The invention can be better understood with reference to the following drawings. The components in the drawings are not necessarily drawn to scale. Instead, emphasis is placed on clearly illustrating the invention. In the drawings, like reference numerals designate corresponding parts throughout the several views.

FIG. 4B is an enlarged view of the constraining device 430 of the flexural device-based suspension shown in FIG. 4A.

FIG. 4C is an enlarged view of the constraining device 432 of the flexural device-based suspension shown in FIG. 4A.

DETAILED DESCRIPTION OF THE INVENTION

In the following disclosure, the direction of travel of the movable elements of the micromachined devices according to the invention will be referred to as the x-direction. The direction perpendicular to the plane of the movable element will be referred to as the z-direction. The direction orthogonal to both the x- and z-directions will be referred to as the y-direction.

Further, the micromachined devices incorporating the flexural device-based suspensions according to the invention will be described in the following disclosure as being composed of a number of components, and certain ones of the components will be described as being connected or attached to one another. However, preferred embodiments of the flexural device-based suspension according to the invention and of the micromachined devices incorporating such suspensions are formed in a single layer of material by micromachining. In such embodiments, the components referred to are in fact portions of a unitary structure, and the components that are described as being connected to one another are in fact integral with one another. This disclosure therefore describes and claims unitary structures in addition to structures composed of components connected to one another.

Figure 1:
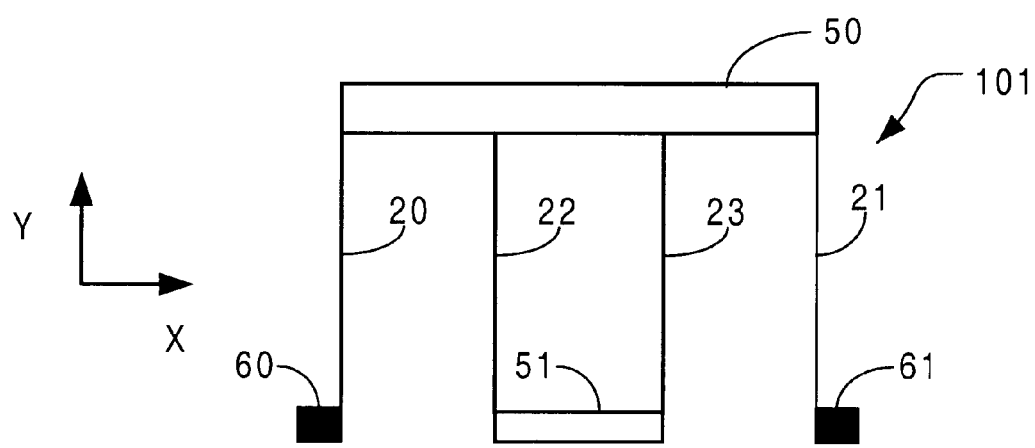
FIG. 1 is a plan view of a known flexural device on which the invention is based.

FIG. 1 shows known flexural device 101 on which the invention is based. Flexural device 101 is usable to suspend movable element 51 of a micromachined device such as an electrostatic actuator or a linear electrostatic motor. Flexural device 101 includes beams 20, 21, 22 and 23 and floating beam 50. Beams 20–23 and floating beam 50 are all elongate, i.e., these beams are all substantially longer than they are wide. Beams 20–23 are substantially narrower than floating beam 50 so that a force applied to each of beams 20–23 in the direction of its width would cause such beam to bend significantly, whereas the same force applied to floating beam 50 in the direction of its width would cause negligible bending. Thus, beams 20–23 are described herein as flexible with respect to a force applied in the direction of their width, whereas floating beam 50 is described as rigid with respect to such force.

Flexible beams 20 and 21 extend substantially perpendicularly from opposite ends of floating beam 50 to fixed supports 60 and 61, respectively. Flexible beams 22 and 23 extend to movable element 51 from points on floating beam 50 intermediate between flexible beams 20 and 21. Flexible beams 22 and 23 extend from floating beam 50 in the same direction as, and substantially parallel to, flexible beams 20 and 21.

Flexural device 101 allows movable element 51 to move in a straight line in the x-direction from its rest position, shown in FIG. 1, in which the flexible beams 20–23 are straight. As movable element 51 is displaced in the x-direction from its rest position, flexible beams 20–23 bend, their curvature increasing with increasing displacement of the movable element. As a result, the y-direction compliance of the flexural device progressively increases. As noted above, this characteristic is undesirable, since it limits the maximum displacement of the movable element in the x-direction before the y-direction compliance becomes unacceptably high.

Figure 2A:
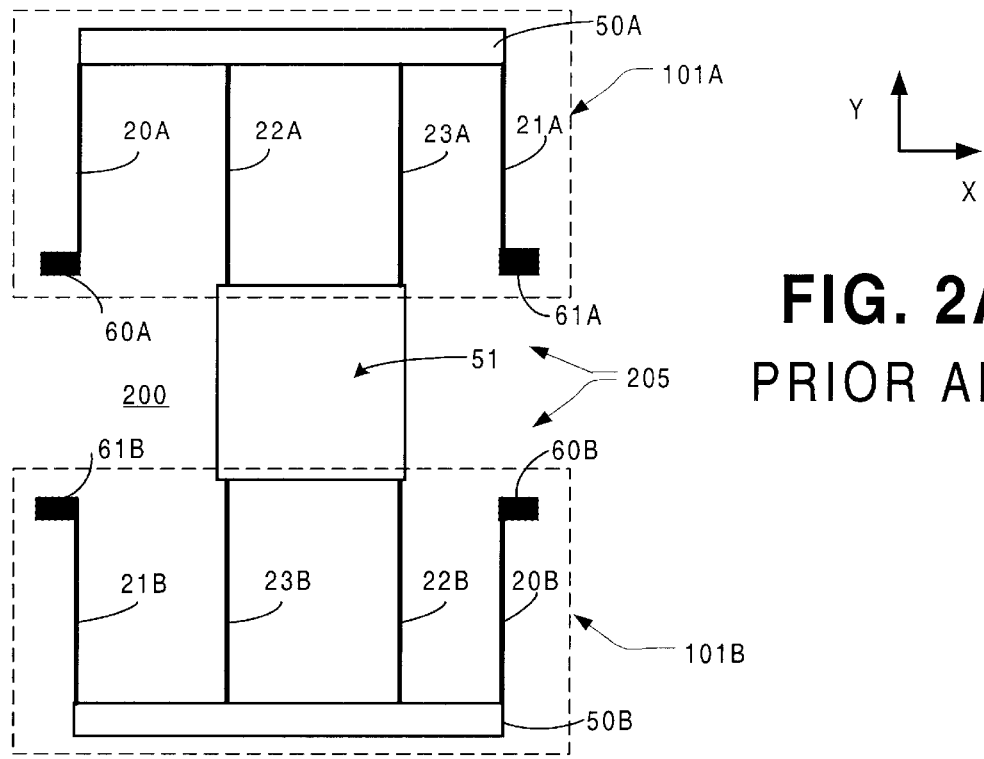
FIGS. 2A and 2B are plan views of a micromachined device incorporating a flexural device-based suspension composed of two of the flexural devices shown in FIG. 1.
Figure 2B:
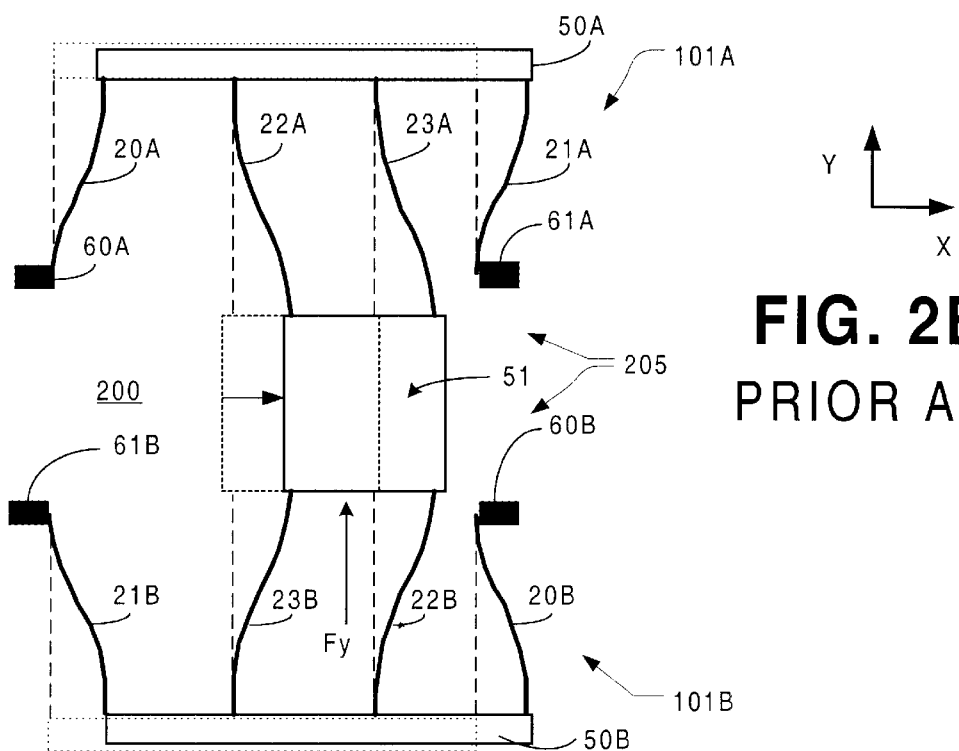

FIGS. 2A and 2B show known micromachined device 200 in which movable element 51 is suspended by flexural device-based suspension 205 that incorporates two of the known flexural devices shown in FIG. 1. Flexural device-based suspension 205 is composed of the flexural devices 101A and 101B located on opposite sides of movable element 51. Flexural devices 101A and 101B are each substantially similar to flexural device 101 shown in FIG. 1. Corresponding elements are indicated using the same reference numerals with the letter A or B, respectively, appended, and will not be described again here.

Flexural device-based suspension 205 has a low compliance in the y-direction when flexible beams 20A–23A and 20B–23B are all straight. The flexible beams are all straight in the rest position of movable element 51 shown in FIG. 2A. When all the flexible beams are straight, they have to buckle to allow any movement of the movable element in the y-direction.

Displacement of movable element 51 in the +x-direction from its rest position causes floating beams 50A and 50B to move in the +x-direction by a distance of half the displacement of the movable element. Displacement of movable element 51 in the +x-direction additionally moves floating member 50A in the −y-direction and floating member 50B in the +y-direction, as shown in FIG. 2B.

Displacement of movable element 51 in the +x-direction from its rest position also bends flexible beams 20A–23A and 20B–23B, also as shown in FIG. 2B. As the displacement of movable element 51 increases, the bending of flexible beams 20A–23A and 20B–23B progressively increases. As a result, the compliance of flexural device-based suspension 205 in the y-direction progressively increases. As noted above, many electrostatic actuators, such as comb drives or surface drives, generate not only a motive force in the direction of travel but also a parasitic force having a component in the y-direction, orthogonal to the direction of travel. As a result, the range of travel of movable element 51 in the x-direction has to be limited to one in which the gradient of the parasitic y-direction force is less than the y-direction compliance of flexural device-based suspension 205.

The invention is based on the inventors' observation of the motion of the floating beams 50A and 50B in response to displacement of movable element 51. Displacement of the movable element in the x-direction causes the floating beams to move by the same distance in the x-direction and causes the floating beams to move towards one another in the y-direction. Thus, displacement of the movable element in the x-direction causes no relative movement of the floating beams in the x-direction, but causes relative movement of the floating beams in the y-direction. On the other hand, displacement of the movable element in the y-direction causes floating beam 50A to move in the −x-direction and floating beam 50B to move in the +x-direction. Thus, displacement of the movable element in the y-direction causes relative movement of the floating beams in the x-direction.

The invention provides a flexural device-based suspension in which a constraining element controls the motion of the floating beams of the flexural devices. The constraining element constrains relative motion of the floating beams in the x-direction, which substantially reduces the compliance of the flexural device-based suspension in the y-direction. The constraining element additionally allows the floating beams to move freely relative to one another in the y-direction, and additionally to move freely by the same distance in the x-direction. As a result, the compliance of the flexural device-based suspension in the x-direction is substantially the same as that of the individual flexural devices. The floating beams will be said to move in concert when they move by the same distance in the same direction.

Figure 3A:
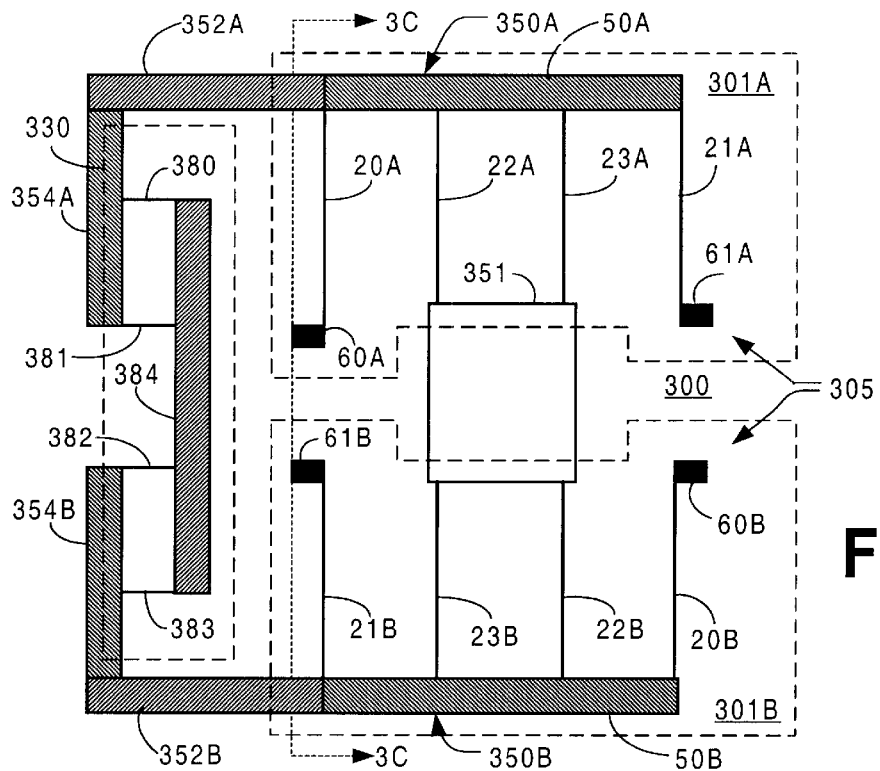
FIG. 3A is a plan view of a first embodiment of a micromachined device according to the invention incorporating a first embodiment of a flexural device-based suspension according to the invention.

FIG. 3A is a plan view of micromachined device 300 in which movable element 351 is suspended by first embodiment 305 of a flexural device-based suspension according to the invention. Flexural device-based suspension 305 is composed of flexural devices 301A and 301B and constraining element 330. Flexural devices 301A and 301B are located on opposite sides of movable element 351 and include floating beams 350A and 350B, respectively. Constraining element 330 constrains relative motion in the x-direction of floating beams 350A and 350B, while allowing the floating beams to move freely relative to one another in the y-direction, and to move freely in concert in the x-direction, as will be described in detail below.

Flexural devices 301A and 301B are each substantially similar to flexural device 101 shown in FIG. 1 and described above with reference to that Figure, but differ in that their floating beams are extended and L-shaped, as will be described below. Elements of the flexural devices 301A and 301B that correspond to elements of the flexural device 101 are indicated by the same reference numerals with the letter A or B. respectively, appended, and will not be described again here. Flexible beams 20A–23A and 20B–23B are typically between 1 $\mu$m and 10 $\mu$m wide, between 1 $\mu$m and several hundred $\mu$m thick and between 100 $\mu$m and 1000 $\mu$m long.

Floating beam 350A will now be described. Floating beam 350A includes connecting portion 50A that connects the ends of flexible beams 20A and 21A remote from supports 60A and 60B, respectively, and the ends of flexible beams 22A and 23A remote from movable element 351. Floating beam 350A additionally includes linear extension 352A that extends in the −x-direction from connecting portion 50A, and lateral extension 354A that extends in the −y-direction from linear extension 352A.

Floating beam 350B is a mirror image of floating beam 350A and will not be separately described.

Constraining element 330 is composed of constraining beams 380, 381, 382, 383 and linking beam 384. Constraining beams 380–383 and linking beam 384 are all elongate, i.e., these beams are all substantially longer than they are wide. Constraining beams 380–383 are substantially narrower than linking beam 384 so that a force applied to each of constraining beams 380–383 in the direction of its width would cause such beam to bend significantly, whereas the same force applied to linking beam 384 in the direction of its width would cause negligible bending. Thus, constraining beams 380–383 are described herein as flexible with respect to a force applied in the direction of their width, whereas linking beam 384 is described as rigid with respect to such force.

Constraining beams 380 and 381 extend to lateral extension 354A from points on linking beam 384 separated in the y-direction. Constraining beams 380 and 381 are substantially parallel to one another and are substantially orthogonal to linking beam 384 and to lateral extension 354A. Constraining beams 382 and 383 extend to lateral extension 354B from points on linking beam 384 separated in the y-direction. Constraining beams 382 and 383 are substantially parallel to one another and are substantially orthogonal to linking beam 384 and to lateral extension 354B. More than the number of constraining beams shown may be employed.

In a preferred embodiment, movable element 351, flexible beams 20A–23A and 20B–23B, constraining beams 380–383, floating beams 350A and 350B, linking beam 384 and fixed supports 60A, 61A, 60B and 61B are all fabricated as an integral structure in a single layer of material, as will be described in more detail below.

Constraining element 330 decreases the compliance of flexure-based suspension structure 305 in the y-direction. When movable element 351 is at its rest position, as shown in FIG. 3A, flexible beams 320A–323A and 320B–323B are all straight. As a result, flexure-based suspension structure 305 inherently has a low compliance in the y-direction. However, absent constraining element 330, as movable element 351 is displaced in the x-direction from its rest position, the compliance of flexural devices 301A and 301B in the y-direction progressively increases, as noted above.

Constraining element 330 decreases the compliance of flexure-based suspension 305 in the y-direction while leaving the compliance of the flexure-based suspension in the x-direction substantially unchanged. The constraining element is has a low compliance in the direction of travel and a high compliance in the y-direction, orthogonal to the direction of travel. Thus, the constraining element resists the ability of floating beams 350A and 350B to move relative to one another in the x-direction in response to a force applied in the y-direction to movable element 351, and allows floating beams 350A and 350B to move freely relative to one another in the y-direction and to move in concert in the x-direction. Resisting relative motion of floating beams 350A and 350B in the x-direction decreases the compliance of the flexure-based suspension in the y-direction, while allowing relative motion of floating beams 350A and 350B in the y-direction and motion of the floating beams in concert in the x-direction maintains the high compliance of the flexure-based suspension in the y-direction.

The width of constraining beams 380–383 is the same as, or similar to, that of flexible beams 320A–323A and 320B–323B. However, the constraining beams may be shorter than the flexible beams by a factor of three or more since the relative motion of floating members 350A and 350B in the y-direction is much smaller than the absolute motion of the ends of the flexible beams in the x-direction. Constraining beams 380–383 may have a uniform width from end to end, as shown in FIG. 3A, or may have a width that changes along the length of the constraining beam in a manner similar to the flexible beams described below with reference to FIGS. 6A–6C.

In an embodiment, each constraining beam 380–383 is a beam of single-crystal silicon having length, width and thickness dimensions of 100 $\mu$m, 2 $\mu$m and 40 $\mu$m, respectively. The compliance of the constraining beams in the y-direction was several thousand times that in the x-direction. For example, in one embodiment, each constraining beam had a compliance of $1.7 \times 10^{-2}$ m/N in the y-direction and a compliance of $6.9 \times 10^{-6}$ m/N in the x-direction.

As constraining beams 380–383, and the constraining beams of the embodiments to be described below, bend in response to force in the y-direction, their compliance in the x-direction increases, but remains substantially lower than their compliance in the y-direction. The constraining beams have a compliance in the y-direction several thousand times that in the y-direction, even when they are bent.

Movable element 351, and the movable elements of the embodiments to be described below, may additionally include drive electrodes that, when energized by an applied voltage or voltage pattern, propel the movable element in the direction of travel. Movable element 351, and the movable elements of the embodiments to be described below, may alternatively include a comb drive or a magnetic actuator.

Figure 3D:
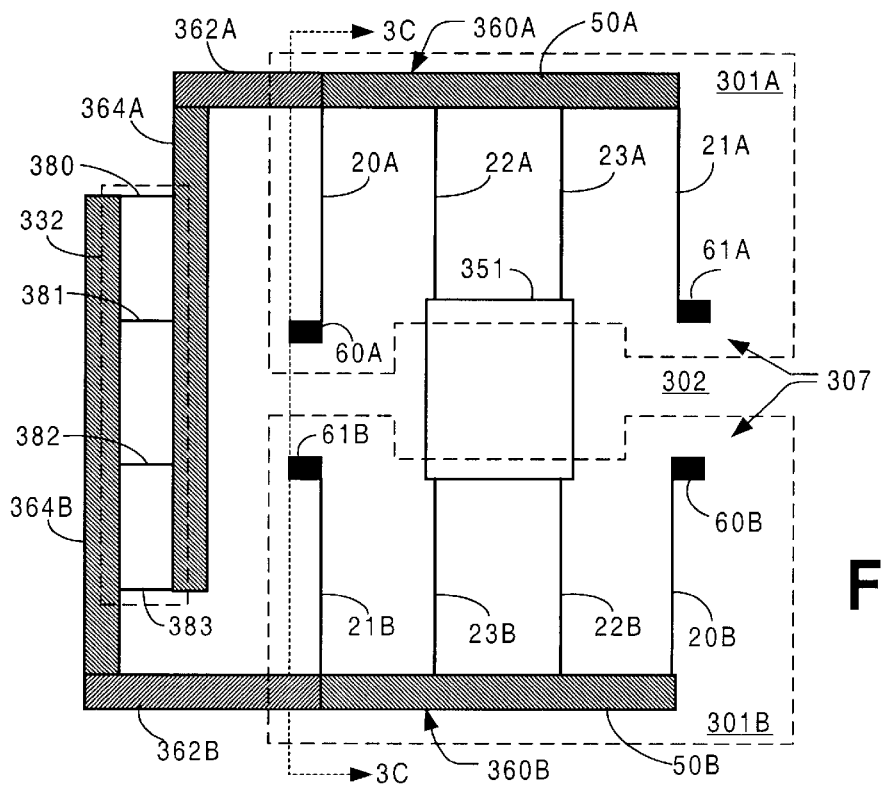
FIG. 3D is a plan view of a variation on the micromachined device shown in FIG. 3A.
Figure 3B:
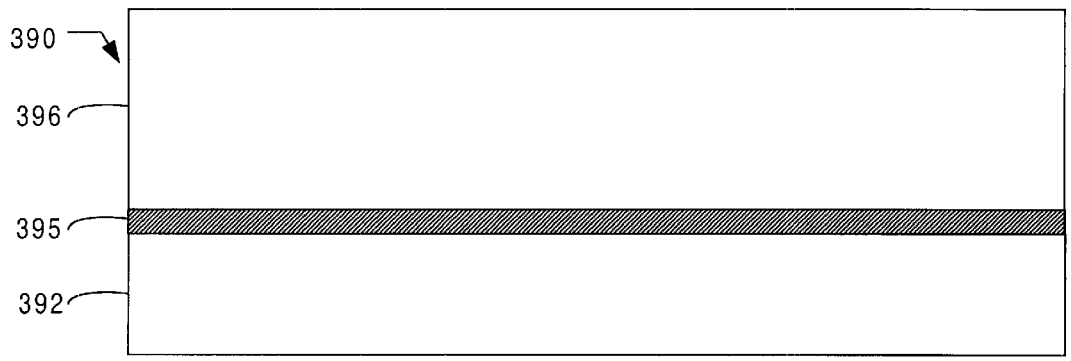
FIG. 3B is a side view of the layer structure in which the micromachined device shown in FIG. 3A is fabricated.

FIG. 3B is a side view of the layer structure 390 in which micromachined device 300 is fabricated. The layer structure is composed of substrate 392, connection layer 395 and device layer 396.

Micromachined device 300, including flexure-based suspension 305, is fabricated in device layer 396 by a photo-lithographic process. Flexure-based suspension 305 includes constraining beams 380–383, flexible beams 320A–323A and 320B–323B, floating beams 350A and 350B, linking beam 384 and fixed supports 60A, 61A, 60B and 61B.

In the photolithographic process, a masking layer (not shown) such as a layer of photoresist, PMMA, or photo-etchable glass is first deposited on device layer 396 and is patterned in the shape of the micromachined device by a lithographic process. The pattern in the masking layer is then transferred to the underlying device layer using an anisotropic etch process. The etch process leaves the micromachined device defined in the device layer. Alternatively, laser ablation or chemically-assisted laser etching could be used to pattern the device layer. In an embodiment, the device layer is a layer of silicon having a substantially uniform thickness. However, other materials, such as glasses, metals, or other semiconductors, may be used as the device layer.

Figure 3C:
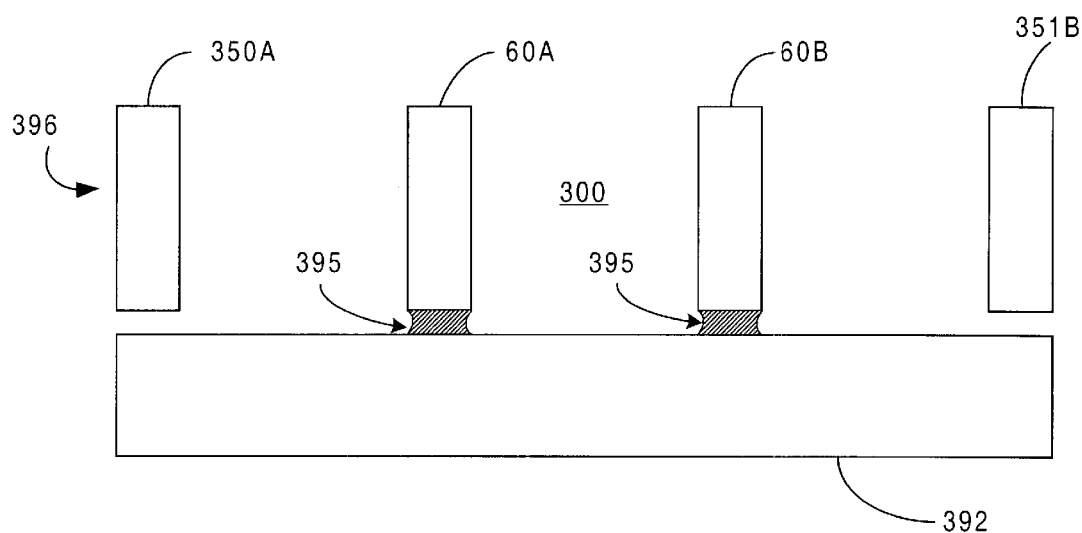
FIG. 3C is a cross-sectional view of the micromachined device shown in FIG. 3A taken along section line 3C—3C in FIG. 3A.

FIG. 3C is a cross sectional view of micromachined device 300 along the section line 3C—3C shown in FIG. 3A. Portions of connection layer 395 are selectively removed to release micromachined device 300, except for fixed supports 60A, 61A, 60B and 61B, from substrate 392. The components of the micromachined device released from substrate 392 are those capable of movement. The figure shows the portions of the device layer that constitute floating beams 350A and 350B released from the substrate and the portions of the device layer that constitute fixed supports 60A and 60B attached to the substrate by remaining portions of connection layer 395.

Fabricating micromachined device 300 by the process just described results in all of the components of the micromachined device having a thickness, i.e., dimension in the z-direction, defined by the thickness of device layer 396. Thus, the components all have the same thickness, and differ only in width, length and shape. However, the micromachined device structure shown in FIG. 3A works well when its components all have the same thickness. The fabrication process just described is considerably simpler than one that would be required to fabricate micromachined device 300 with components having different thicknesses. The thickness of device layer 396 ranges from about 0.1 $\mu$m to several hundred $\mu$m. In an embodiment, the device layer had a thickness of 100 $\mu$m.

The process just described may additionally be used to fabricate the embodiments of the micromachined device according to the invention to be described below.

An alternative embodiment of flexural device-based suspension 305 includes two constraining elements. In such flexural device-based suspension, floating beams 350A and 350B are each U-shaped. A U-shaped embodiment of floating beam 350A, for example, includes an additional linear extension and an additional lateral extension disposed substantially symmetrically with respect to linear extension 352A and lateral extension 354A, respectively. The second constraining element is a mirror image of constraining element 330 shown in FIG. 3A. Its constraining beams extend from the additional lateral extensions of the U-shaped floating beams in a manner similar to the way that constraining beams 380–382 extend from lateral extensions 354A and 354B.

FIG. 3D shows a variation 302 of micromachined device 300 in which movable element 351 is suspended by a variation 307 of flexural device-based suspension 305 shown in FIG. 3A. Elements of flexural device-based suspension 307 that correspond to elements of flexural device-based suspension 305 shown in FIG. 3A are indicated by the same reference numerals and will not be described again.

In flexural device-based suspension 307, linear extensions 362A and 362B that form part of floating beams 360A and 360B, respectively, differ in length by the length of constraining beams 380–383. Additionally, lateral extensions 364A and 364B are lengthened relative to lateral extensions 354A and 354B so that lateral extensions 364A and 364B overlap in the y-direction.

Constraining element 332 is composed of constraining beams 380, 381, 382 and 383 that extend substantially in the x-direction between lateral extension 364A and lateral extension 364B at points separated in the y-direction. Four constraining beams are shown, but this is not critical to the invention: the constraining element may be composed of more or fewer constraining beams.

Figure 4A:
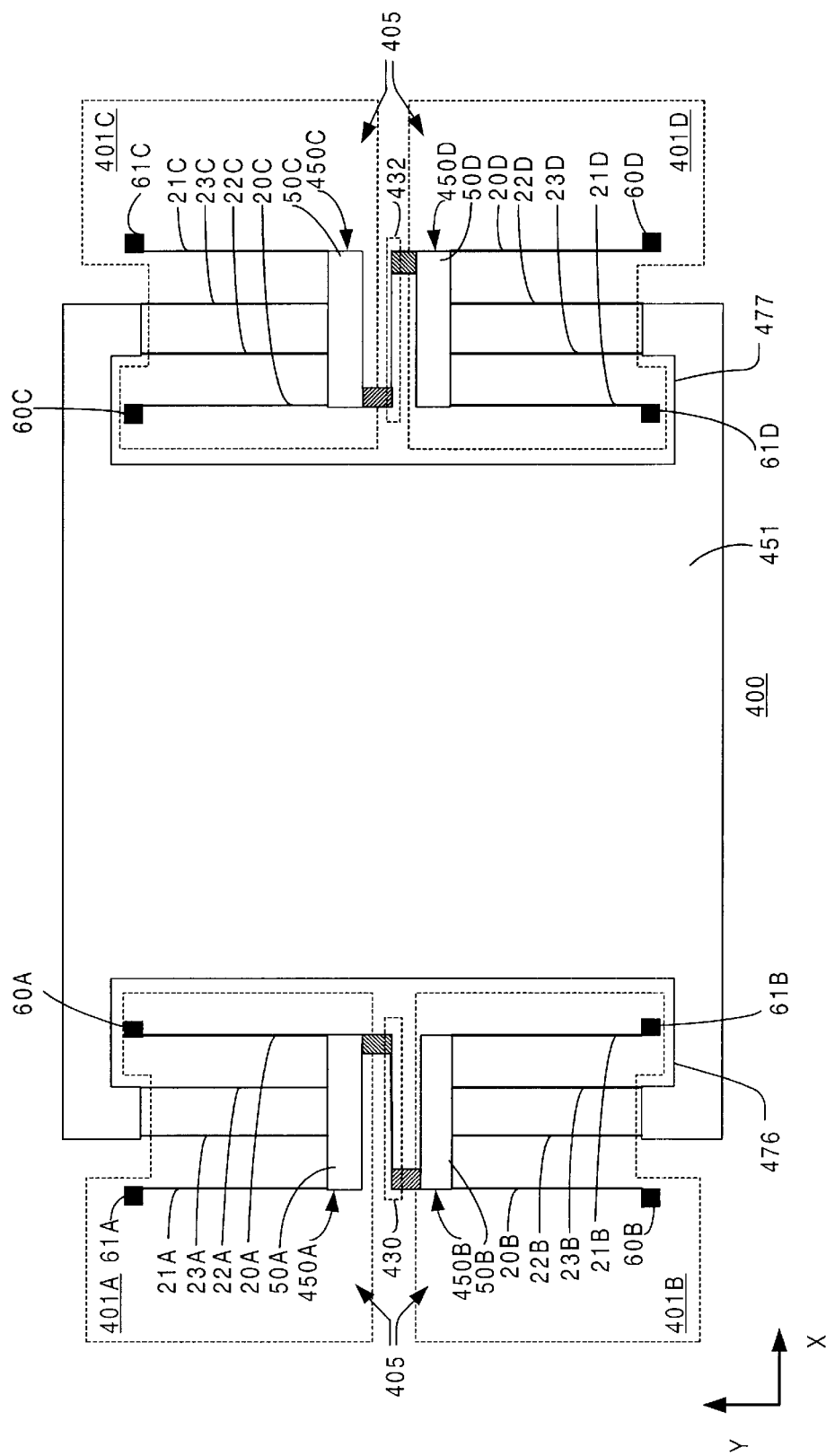
FIG. 4A is a plan view of a second embodiment of a micromachined device according to the invention incorporating a second embodiment of a flexural device-based suspension according to the invention.

FIG. 4A shows a second embodiment 400 of a micromachined device according to the invention in which movable element 451 is suspended by second embodiment 405 of a flexural device-based suspension according to the invention. Flexural device-based suspension 405 is composed of flexural devices 401A and 401B, flexural devices 401C and 401D, constraining element 430 and constraining element 432. Flexural devices 401A and 401B constitute a first pair of flexural devices and are located on one side of movable element 451. Flexural devices 401C and 401D constitute a second pair of flexural devices and are located on the side of movable element 451 opposite flexural devices 401A and 401B. Constraining element 430 controls the motion of floating beams 450A and 450B that form part of flexural devices 401A and 401B, respectively. Constraining element 432 controls the motion of floating beams 450C and 450D that form part of flexural devices 401C and 401D, respectively.

Constraining elements 430 and 432 constrain relative motion in the x-direction of floating beams 450A, 450B and 450C, 450D that form part of flexural devices 401A–401D, respectively, and therefore decrease the compliance of suspension 405 in the y-direction. Constraining element 430 additionally allows floating beams 450A and 450B to move freely in the y-direction relative to one another and to move freely in concert in the x-direction. Constraining element 432 additionally allows floating beams 450C and 450D to move freely in the y-direction relative to one another and to move freely in concert in the x-direction. Accordingly, suspension 405 has a high compliance in the direction of travel of the movable element 451.

Flexural devices 401A, 401B, 401C and 401D are each substantially similar to flexural device 101 shown in FIG. 1 and described above with reference to that Figure. Elements of the flexural devices 401A, 401B, 401C and 401D that correspond to elements of flexural device 101 are indicated by the same reference numerals with the letter A, B, C or D, respectively, appended, and will not be described again here.

Flexural devices 401A, 401B, 401C and 401D differ from flexural device 101 in that their floating beams 450A, 450B, 450C and 450D, respectively, are L-shaped, as shown in greater detail in FIGS. 4B and 4C. Floating beams 450A, 450B, 450C and 450D include lateral extensions 454A, 454B, 454C and 454D, respectively, extending in the y-direction from connecting portions 50A, 50B, 50C and 50D, respectively. Lateral extensions 454A and 454B are at the ends of connecting portions 50A and 50B, respectively, adjacent flexible beams 20A and 20B, respectively. Since flexural device 401B is inverted relative to flexural device 401A, lateral extensions 454A and 454B are at opposite ends of connecting portions 50A and 50B, respectively, from one another. This maximizes the length of constraining beam 480 for a given length of connecting portions 50A and 50B. Similarly, lateral extensions 454C and 454D are at the end of connecting portions 50C and 50D, respectively, adjacent flexible beams 20C and 20D. Since flexural device 401D is inverted relative to flexural device 401B, lateral extensions 454C and 454D are at opposite ends of connecting portions 50C and 50D, respectively, from one another. This maximizes the length of constraining beam 482 for a given length of connecting portions 50C and 50D.

Movable element 451 is shaped to define recesses 476 and 477. Recess 476 accommodates part of flexural devices 401A and 401B, including fixed supports 60A and 61B. Recess 477 accommodates part of flexural devices 401C and 401D, including fixed supports 60C and 61D.

FIG. 4B shows floating beams 450A and 450B, parts of flexible beams 20A–23A and 20B–23B and constraining element 430 in more detail. Constraining element 430 is composed of constraining beam 480 that extends in the −x-direction between lateral extension 454A of floating beam 450A and lateral extension 454B of floating beam 450B. Constraining beam 480 constrains relative motion of floating beams 450A and 450B in the x-direction, yet allows floating beams 450A and 450B to move freely in the y-direction relative to one another. Constraining beam 480 additionally allows floating beams 450A and 450B to move freely in concert in the x-direction.

FIG. 4C shows floating beams 450C and 450D, parts of flexible beams 20C–23C and 20D–23D and constraining element 432 in more detail. Constraining element 432 is composed of constraining beam 482 that extends in the +x-direction between lateral extension 454C of floating beam 450C and lateral extension 454D of floating beam 450D. Constraining beam 482 constrains relative motion of floating beams 450C and 450D in the x-direction, yet allows floating beams 450C and 450D to move freely in the y-direction relative to one another. Constraining beam 482 additionally allows floating beams 450C and 450D to move freely in concert in the x-direction.

Each constraining beam 480 and 482 is elongate and has a width similar to the width of the flexible beams, e.g., flexible beams 20A–23A. Consequently, constraining beams 480 and 482 are flexible in the y-direction. In an embodiment, constraining beams 480 and 482 are each a beam of single-crystal silicon having length, width and thickness dimensions of 100 $\mu$m, 2 $\mu$m and 40 $\mu$m, respectively. In another embodiment, each constraining beam had a compliance of $1.7\times10^{-2}$ m/N in the y-direction and a compliance of $6.9\times10^{-6}$ m/N in the x-direction.

Constraining beams 480 and 482 are disposed lengthwise in the x-direction. Constraining beam 480, disposed lengthwise in the x-direction and interconnecting floating beams 450A and 450B, has a low compliance in the x-direction, and therefore resists relative motion of floating beams 450A and 450B in the x-direction. Similarly, constraining beam 482, disposed lengthwise in the x-direction and interconnecting floating beams 450C and 450D, has a low compliance in the x-direction and therefore resists relative motion of floating beams 450C and 450D in the x-direction. The constraining beams constraining the relative motion of floating beams 450A and 450B and of floating beams 450C and 450D in the x-direction, i.e., the direction of travel of movable element 451, decrease the compliance of flexure-based suspension 405 in the y-direction, normal to the direction of travel.

As movable element 451 is displaced in its direction of travel, floating beams 450A and 450B move relative to one another in the y-direction, and floating beams 450C and 450D move relative to one another in the y-direction. The constraining beams, disposed lengthwise in the x-direction, are flexible in the y-direction and so allow floating beams 450A and 450B to move freely relative to one another in the y-direction, and additionally allow the floating beams 450C and 450D to move freely relative to one another in the y-direction. Finally, the constraining beams, disposed lengthwise in the x-direction, allow the floating beams to move freely in concert in the x-direction. Thus, the flexural device-based suspension 405 allows the movable element to move freely in its direction of travel.

Figure 5:
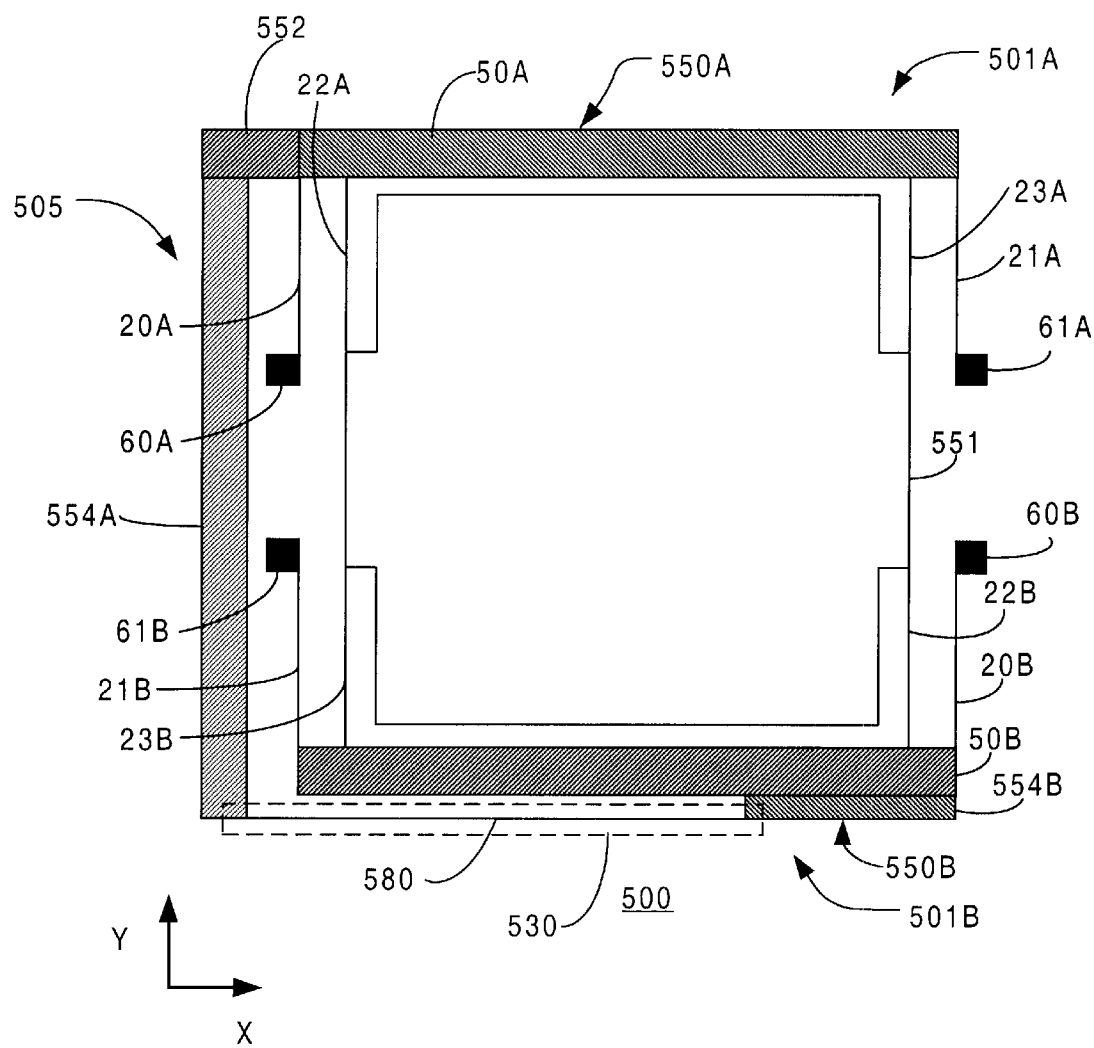
FIG. 5 is a plan view of a third embodiment of a micromachined device according to the invention incorporating a third embodiment of a flexural device-based suspension according to the invention.

FIG. 5 shows third embodiment 500 of a micromachined device according to the invention in which movable element 551 is suspended by third embodiment 505 of a flexure-based suspension according to the invention. Flexural device-based suspension 505 is composed of flexural devices 501A and 501B and constraining element 530. Flexural devices 501A and 501B are located on opposite sides of movable element 551. Constraining element 530 constrains relative motion in the x-direction of floating beams 550A and 550B that form part of flexural devices 501A and 501B, respectively, to decrease the compliance of suspension 505 in the y-direction. Constraining element 530 additionally allows the floating beams to move freely in the y-direction relative to one another and to move freely in concert in the x-direction. Accordingly, suspension 505 has a high compliance in the direction of travel of the movable element 551.

Flexural devices 501A and 501B are each substantially similar to flexural device 101 shown in FIG. 1 and described above with reference to that Figure. Flexural device 501A differs in that floating beam 550A is extended and L-shaped, and flexural device 501B differs in that floating beam 550B is L-shaped, as will be described below. Elements of the flexural devices 501A and 501B that correspond to elements of the flexural device 101 are indicated by the same reference numerals with the letter A or B, respectively, appended, and will not be described again here.

Floating beam 550A includes connecting portion 50A that links the ends of flexible beams 20A and 21A remote from supports 60A and 61A, respectively, and the ends of flexible beams 22A and 23A remote from movable element 551. Floating beam 550A additionally includes linear extension 552A that extends in the −x-direction from connecting portion 50A, and lateral extension 554A that extends in the −y-direction from linear extension 551A.

Floating beam 550B includes connecting portion 50B that links the ends of flexible beams 20B and 21B remote from supports 60B and 61B, respectively, and the ends of flexible beams 22A and 23A remote from movable element 551. Floating beam 550B additionally includes lateral extension 554A that extends in the +y-direction from connecting portion 50B near the junction of connecting portion 50B and flexible beams 20B and 22B.

Constraining element 530 is composed of constraining beam 580 that extends substantially in the x-direction between the end of lateral extension 554A remote from linear extension 552 and lateral extension 554B. Constraining beam 580 has a width similar to the width of the flexible beams, e.g., flexible beams 20A–23A, and so is flexible in the y-direction. In an embodiment, the constraining beam is a beam of single-crystal silicon having length, width and thickness dimensions of 100 μm, 2 μm and 40 μm, respectively. In another embodiment, the constraining beam had a compliance of $1.7 \times 10^{-2}$ m/N in the y-direction and a compliance of $6.9 \times 10^{-6}$ m/N in the x-direction.

Constraining beam 580, disposed lengthwise in the x-direction and interconnecting floating beams 550A and 550B, has a low compliance in the x-direction, and therefore resists relative motion of floating beams 550A and 550B in the x-direction. Constraining the relative motion of floating beams 550A and 550B in the x-direction, i.e., the direction of travel of movable element 551, reduces the compliance of flexure-based suspension 505 in the y-direction, normal to the direction of travel.

As movable element 551 is displaced in its direction of travel (x-direction), floating beams 550A and 550B move relative to one another in the y-direction. Constraining beam 580 disposed lengthwise in the x-direction is flexible in the y-direction and so allows floating beams 550A and 550B to move relative to one another in the y-direction. Moreover, constraining beam 580, disposed lengthwise in the x-direction, allows the floating beams to move freely in concert in the x-direction. Thus, flexural device-based suspension 505 allows the movable element to move freely in its direction of travel.

Figure 6A:
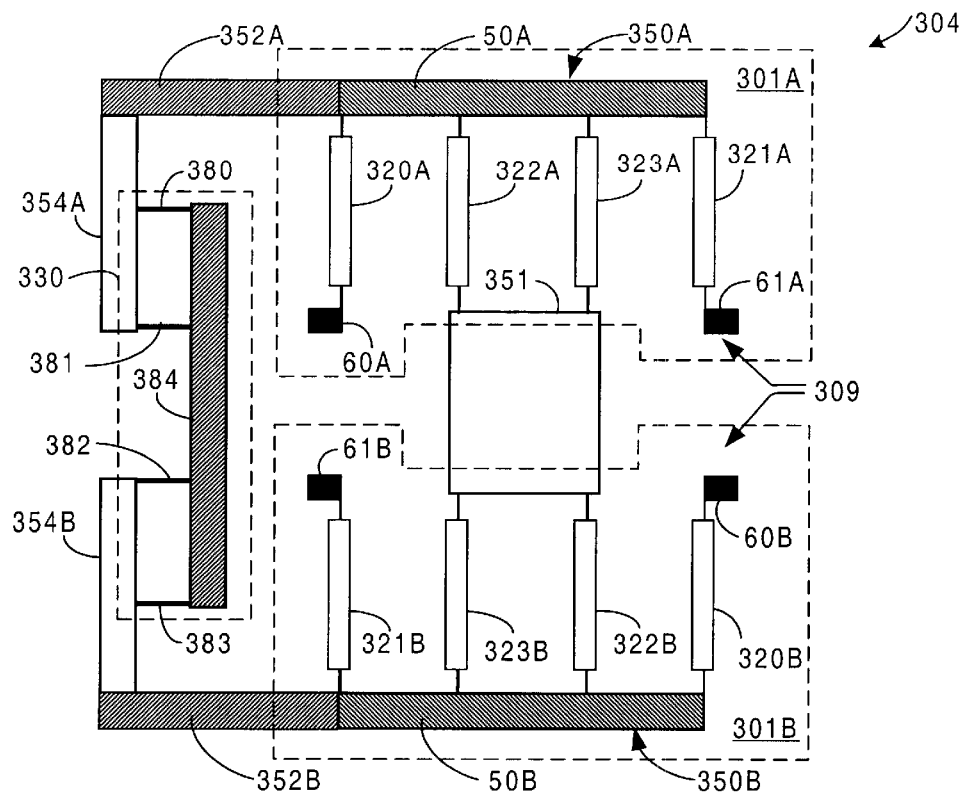
FIG. 6A is a plan view of another variation of the micromachined device shown in FIG. 3A.
Figure 6B:
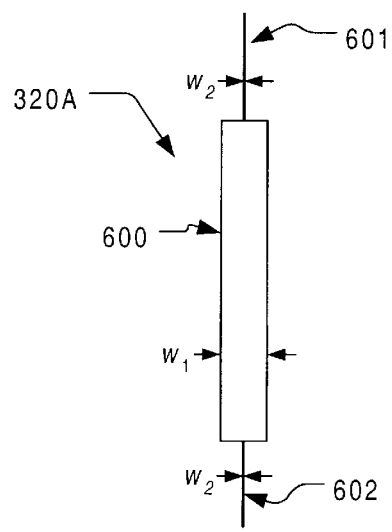
FIG. 6B is an enlarged view of the flexible beams of the flexural device-based suspension shown in FIG. 6A.

FIG. 6A shows variation 304 on micromachined device 300 shown in FIG. 3A in which movable element 351 is suspended by flexural device-based suspension 309 in which each of flexible beams 320A–323A and 320B–323B is shaped to include a center portion that is wider than its end portions. Flexible beams structured as shown in FIG. 6A have a lower compliance than the flexible beams structured as shown in FIG. 3A. FIG. 6B shows an example in which flexible beam 320A includes a center portion 600 whose width $w_1$ is greater than the width $w_2$ of end portions 601 and 602.

Figure 7A:
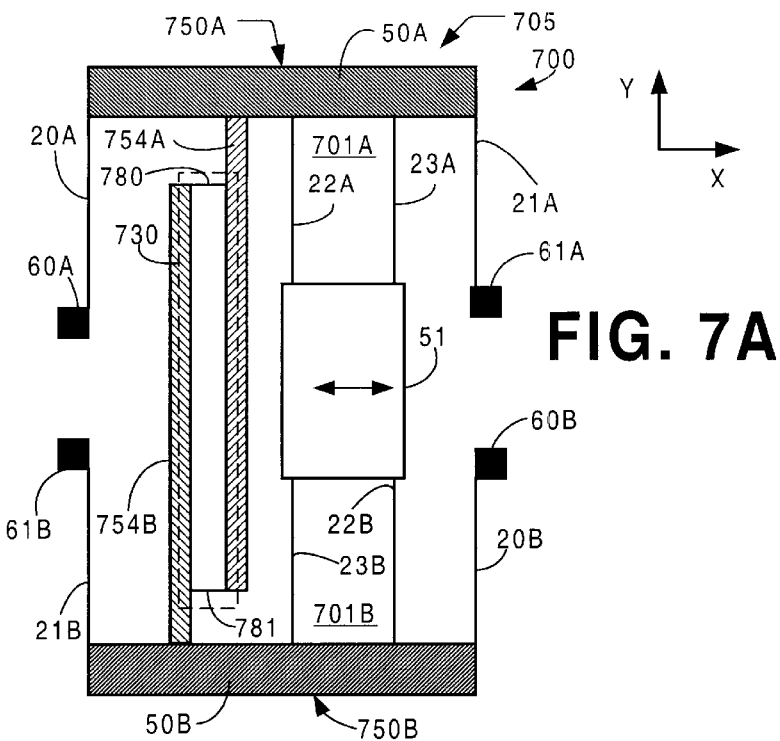
FIGS. 7A and 7B are plan views of a fourth embodiment of a micromachined device according to the invention incorporating a fourth embodiment of a flexural device-based suspension according to the invention.

FIG. 7A shows fourth embodiment 700 of a micromachined device according to the invention in which movable element 51 is suspended by fourth embodiment 705 of a flexural device-based suspension according to the invention. Flexural device-based suspension 705 is composed of flexural devices 701A and 701B and constraining element 730. Flexural devices 701A and 701B are located on opposite sides of movable element 51. Constraining element 730 constrains relative motion in the x-direction of floating beams 750A and 750B that form part of flexural devices 701A and 701B, respectively, to decrease the compliance of suspension 705 in the y-direction. Constraining element 730 additionally allows the floating beams to move freely in the y-direction relative to one another, and to move freely in concert in the x-direction, Accordingly, suspension 705 has a high compliance in the direction of travel of the movable element 51.

Flexural devices 701A and 701B are each substantially similar to flexural device 101 shown in FIG. 1 and described above with reference to that Figure. Flexural device 701A differs in that floating beam 750A is T-shaped, and flexural device 701B differs in that floating beam 750B is T-shaped, as will be described below. Elements of the flexural devices 701A and 701B that correspond to elements of the flexural device 101 are indicated using the same reference numerals with the letter A or B, respectively, appended, and will not be described again here.

Floating beam 750A includes connecting portion 50A that links the ends of flexible beams 20A and 21A remote from supports 60A and 61A, respectively, and the ends of flexible beams 22A and 23A remote from movable element 51. Floating beam 550A additionally includes lateral extension 754A that extends in the −y-direction from a point on connecting portion 50A between flexible beams 20A and 22A.

Floating beam 750B includes connecting portion 50B that links the ends of flexible beams 20B and 21B remote from supports 60B and 61B, respectively, and the ends of flexible beams 22B and 23B remote from movable element 51. Floating beam 750B additionally includes lateral extension 754B that extends in the +y-direction from a point on connecting portion 50B between flexible beams 21B and 23B. Lateral extension 754B is offset in the x-direction from lateral extension 754A by the length of the constraining beams 780 and 781, to be described below. An offset in the −x-direction is shown, but the offset may alternatively be in the +x-direction.

Constraining element 730 is composed of constraining beams 780 and 781 that extend substantially in the x-direction between lateral extension 754A and lateral extension 754B at points separated in the y-direction. Each of constraining beams 780 and 781 has a width similar to the width of the flexible beams, e.g., flexible beams 20A–23A, and so is flexible in the y-direction. The constraining beams are typically shorter than the flexible beams, but this is not critical to the invention. In an embodiment, each constraining beam is an elongate beam of single-crystal silicon having length, width and thickness dimensions of 100 μm, 2 μm and 40 μm, respectively. In another embodiment, each constraining beam had a compliance of $1.7 \times 10^{-2}$ m/N in the y-direction and a compliance of $6.9 \times 10^{-6}$ m/N in the x-direction.

Constraining beams 780 and 781, disposed lengthwise in the x-direction and interconnecting floating beams 750A and 750B, have a low compliance in the x-direction and therefore resist relative motion of floating beams 750A and 750B in the x-direction. Constraining the relative motion of floating beams 750A and 750B in the x-direction, i.e., the direction of travel of movable element 51, decreases the compliance of flexure-based suspension 705 in the y-direction, normal to the direction of travel.

As movable element 51 is displaced in its direction of travel, floating beams 750A and 750B move relative to one another in the y-direction. Constraining beams 780 and 781 disposed lengthwise in the x-direction are flexible in the y-direction and so allow floating beams 750A and 750B to move freely relative to one another in the y-direction. Moreover, constraining beam 780, disposed lengthwise in the x-direction, allows the floating beams to move freely in concert in the x-direction. Thus, the flexural device-based suspension 705 allows the movable element to move freely in its direction of travel.

In flexural device-based suspension 705, constraining element 730 connects to floating beams 750A and 750B part-way along the length of the floating beams. This locates fixed supports 60A, 60B, 61A and 61B at the outer periphery of micromachined device 700. Referring briefly to FIGS. 3B and 3C, it is sometimes challenging to release the movable components of the micromachined device from substrate 392 while leaving the fixed supports 60A, 60B, 61A and 61B firmly attached to the substrate by portions of connection layer 395. The micromachined device shown in FIG. 7A lends itself to fabrication in a single layer, i.e., the device layer 396 shown in FIG. 3B, or in a layer structure similar to that shown in FIG. 3B in which the non-movable components of the micromachined device are attached to the substrate by large, easy-to-fabricate connections.

Figure 7B:
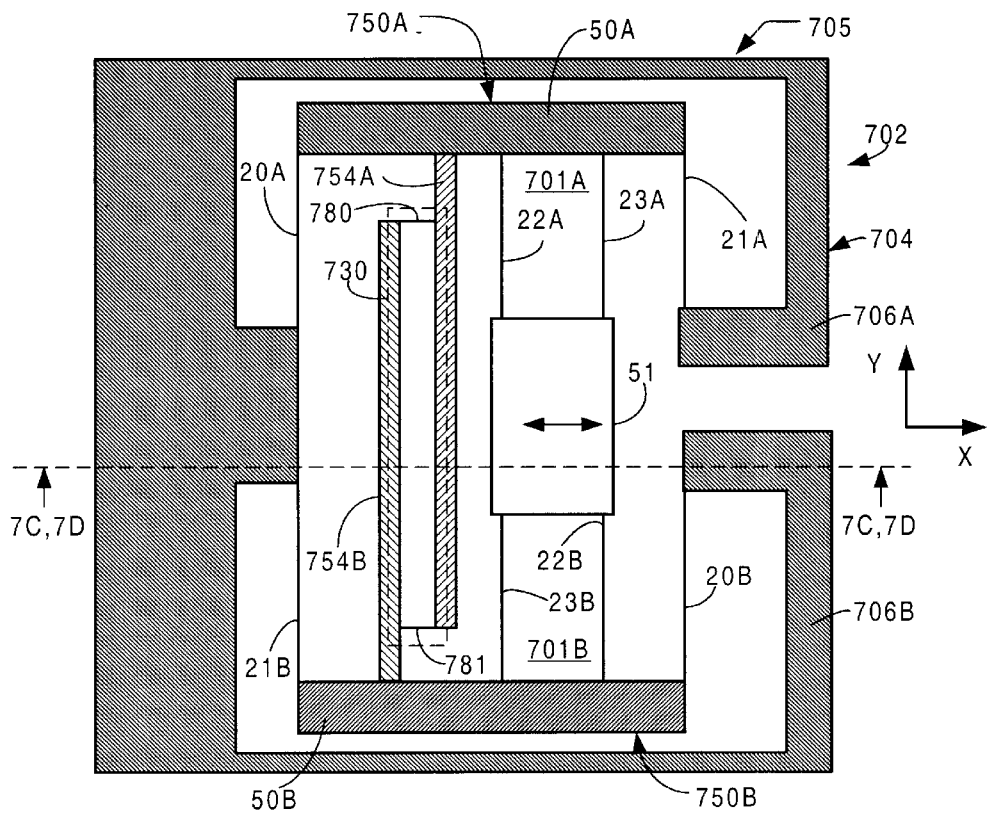

FIG. 7B shows a variation 702 on micromachined device 700 shown in FIG. 7A. Micromachined device 702 is capable of being fabricated in a single layer of material or in a layer structure in which the non-movable components of the micromachined device are attached to the substrate by large, easy-to-fabricate connections. Elements of micromachined device 702 that correspond to elements of micromachined device 700 shown in FIG. 7A are indicated by the same reference numerals and will not be described again here.

Micromachined device 702 includes E-shaped perimeter frame 704. The perimeter frame includes linked C-shaped portions 706A and 706B. C-shaped portion 706A substantially surrounds flexural device 701A and C-shaped portion 706B substantially surrounds flexural device 701B. Flexible beams 20A and 21A extend from floating beam 750A to opposite ends of C-shaped portion 706A and flexible beams 20B and 21B extend from floating beam 750B to opposite ends of C-shaped portion 706B. The C-shaped portions are shown joined adjacent their junctions with flexible beams 20A and 21B, and may additionally be linked adjacent their junctions with flexible beams 20B and 21A.

Figure 7C:
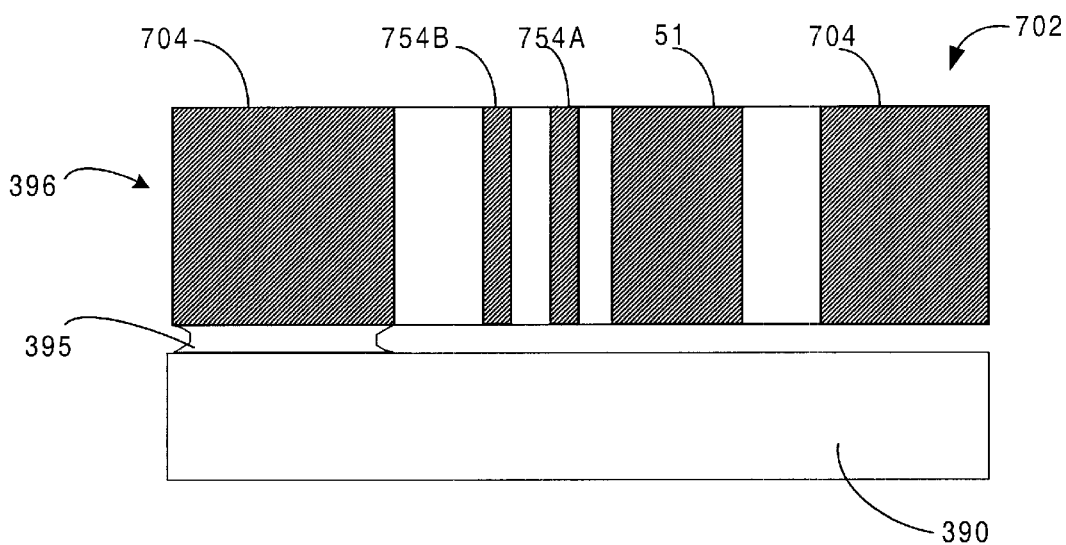
FIG. 7C is a cross-sectional view of a multi-layer embodiment of the micromachined device shown in FIG. 7B taken along section line 7C—7C in FIG. 7B.

FIG. 7C is a cross-sectional view of an embodiment of micromachined device 702 formed in a multi-layer structure 390. Perimeter frame 704 and the remaining components of micromachined device 702 are formed in device layer 396, part of which is connected to substrate 390 by connection layer 395. After micromachined device 702 has been defined in device layer 396, connection layer 395 is selectively removed leaving the part of the perimeter frame shown attached to substrate 390 by the large island of connection layer 395 shown.

Figure 7D:
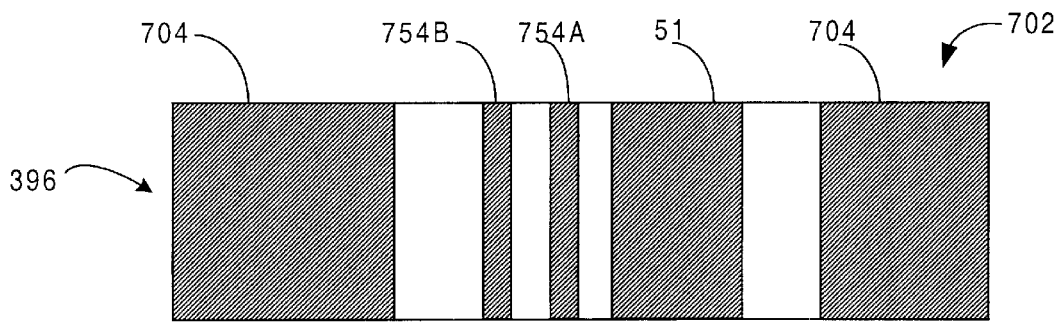
FIG. 7D is a cross-sectional view of a single-layer embodiment of the micromachined device shown in FIG. 7B taken along section line 7D—7D in FIG. 7B.

FIG. 7D is a cross-sectional view of an embodiment of micromachined device 702 formed as a single-layer device in device layer 396. The micromachined device is formed in a multi-layer structure similar to multi-layer structure 390 shown in FIG. 3B. After micromachined device 702 has been defined in the device layer, connection layer 395 is completely removed to detach the single-layer micromachined device from the substrate.

In both embodiments shown in FIG. 7C and 7D, perimeter frame 704 provides fixed supports for the ends of flexible beams 20A, 21A and 20B, 21B remote from floating beams 750A and 751B, respectively.

Although this disclosure describes illustrative embodiments of the invention in detail, it is to be understood that the invention is not limited to the precise embodiments described, and that various modifications may be practiced within the scope of the invention defined by the appended claims.

We claim:

1. A flexural device-based suspension for suspending a movable element with high compliance in a direction of travel and low compliance in a direction orthogonal thereto, the suspension comprising:

two flexural devices connected to the movable element, the flexural devices each including an elongate floating beam disposed substantially parallel to the direction of travel; and constraining means for constraining relative motion of the floating beams in the direction of travel and for allowing the floating beams to move freely relative to one another in the orthogonal direction.

2. The flexural device-based suspension of claim 1, in which the constraining means is additionally for allowing the floating beams to move freely in concert in the direction of travel.

3. The flexural device-based suspension of claim 1, in which:

the flexural device-based suspension additionally comprises a device layer; and at least the flexural devices and the constraining means constitute portions of the device layer.

4. The flexural device-based suspension of claim 3, in which:

the device layer has a thickness; and at least the flexural devices and the constraining means have a thickness substantially equal to the thickness of the device layer.

5. The flexural device-based suspension of claim 1, in which each of the flexural devices additionally includes:

a fixed support; and flexible beams extending from the elongate floating beam, two adjacent ones of the flexible beams extending to the movable element and the fixed support.

6. The flexural device-based suspension of claim 1, in which the constraining means includes at least one elongate constraining beam extending substantially in the direction of travel between the floating beams.

7. The flexural device-based suspension of claim 6, in which:

the constraining beam has a compliance in the direction of travel and a compliance in the orthogonal direction; and the compliance in the orthogonal direction is orders of magnitude greater than the compliance in the direction of travel.

8. The flexural device-based suspension of claim 6, in which the constraining beam is elongate, is disposed parallel to the direction of travel, has a thickness orthogonal to the direction of travel, and has a length at least 10 times the thickness.

9. The flexural device-based suspension of claim 6, in which:

the constraining beam has a length and a width; and the constraining beam includes a wider portion extending part-way along its length.

10. The flexural device-based suspension of claim 6, in which:

the floating beams each include a lateral extension extending therefrom in the orthogonal direction; and the at least one constraining beam extends between the lateral extensions of the floating beams.

11. The flexural device-based suspension of claim 10, in which:

the floating beam includes a connecting portion;

the flexural devices each additionally include flexible beams extending from the connecting portion of the floating beam;

at least one of the floating beams includes a linear extension extending in the direction of travel from the connecting portion thereof; and the lateral extension extends from the linear extension.

12. The flexural device-based suspension of claim 10, in which both of the floating beams include a linear extension.

13. The flexural device-based suspension of claim 10, in which:

the floating beam includes a connecting portion;

the flexural devices each additionally include:

a fixed support, and flexible beams extending from the connecting portion of the floating beam, two adjacent ones of the flexible beams extending to the movable element and the fixed support; and the lateral extension extends from a point in the floating beam intermediate between the two adjacent ones of the flexible beams.

14. The flexural device-based suspension of claim 13, additionally comprising a perimeter frame that includes the fixed support and at least one additional fixed support.

15. The flexural device-based suspension of claim 1, in which:

the floating beams each include a lateral extension extending therefrom substantially in the orthogonal direction; and the constraining means includes:

an elongate linking beam disposed substantially in the orthogonal direction, and elongate constraining beams extending substantially in the direction of travel between the linking beam and the lateral extensions.

16. The flexural device-based suspension of claim 15, in which:

the constraining beam has a compliance in the direction of travel and a compliance in the orthogonal direction; and the compliance in the orthogonal direction is orders of magnitude greater than the compliance in the direction of travel.

17. The flexural device-based suspension of claim 1, in which:

the flexural devices are first flexural devices, include first floating beams and are located on a first side the movable element;

the flexural device-based suspension additionally comprises two second flexural devices located on a second side of the movable element, opposite the first side, the second flexural devices each including an elongate second floating beam disposed substantially in the direction of travel; and the constraining means is additionally for constraining relative motion of the second floating beams in the direction of travel and is additionally for allowing the second floating beams to move freely relative to one another in the orthogonal direction.

18. A micromachined device, comprising:

a movable element;

a first flexural device and a second flexural device located on opposite sides of the movable element and permitting movement of the movable element in a direction of travel, each of the flexural devices including an elongate floating beam substantially parallel to the direction of travel; and a constraining element extending between the floating beams, the constraining element having a low compliance in the direction of travel and a high compliance in a direction orthogonal to the direction of travel.

19. The micromachined device of claim 18, in which:

the micromachined device additionally comprises a device layer; and at least the movable element, the flexural devices and the constraining element constitute portions of the device layer.

20. The micromachined device of claim 18, in which each of the flexural devices additionally includes:

a fixed support; and flexible beams extending from the floating beam, two adjacent ones of the flexible beams extending to the movable element and the fixed support.

21. The micromachined device of claim 18, in which the constraining element includes at least one elongate constraining beam extending substantially in the direction of travel between the floating beams.

22. The micromachined device of claim 21, in which:

the constraining beam has a compliance in the direction of travel and a compliance in the orthogonal direction; and the compliance in the orthogonal direction is orders of magnitude greater than the compliance in the direction of travel.

23. The micromachined device of claim 21, in which:

the floating beams each include a lateral extension extending therefrom in the orthogonal direction; and each of the at least one constraining beam extends between the lateral extensions of the floating beams.

24. The micromachined device of claim 23, in which:

the floating beam includes a connecting portion;

the flexural devices each include flexible beams extending from the connecting portion of the floating beam;

at least one of the floating beams includes a linear extension extending in the direction of travel from the connecting portion; and the lateral extension extends in the orthogonal direction from the linear extension.

25. The micromachined device of claim 23, in which both of the floating beams include a linear extension.

26. The micromachined device of claim 23, in which:

the floating beam includes a connecting portion;

the flexural devices each additionally include:

a fixed support, and flexible beams connected extending from the connecting portion of the floating beam, two adjacent ones of the flexible beams extending to the movable element and the fixed support; and the lateral extension extends from a point in the floating beam intermediate between the two adjacent ones of the flexible beams.

27. The micromachined device of claim 26, additionally comprising a perimeter frame that includes the fixed support and at least one additional fixed support.

28. The micromachined device of claim 18, in which:

the floating beams each include a lateral extension extending therefrom substantially in the orthogonal direction; and the constraining element includes:

an elongate linking beam disposed substantially in the orthogonal direction, and elongate constraining beams extending substantially in the direction of travel between the linking beam and the lateral extensions.

29. The micromachined device of claim 28, in which:

the constraining beam has a compliance in the direction of travel and a compliance in the orthogonal direction; and the compliance in the orthogonal direction is orders of magnitude greater than the compliance in the direction of travel.

30. The micromachined device of claim 18, in which:

the flexural devices are first flexural devices and include first floating beams;

the micromachined device additionally comprises two second flexural devices located on opposite sides of the movable element and offset from the first flexural devices in the orthogonal direction, the second flexural devices each including an elongate second floating beam disposed substantially in the direction of travel;

the constraining element is a first constraining element and extends between the floating beams of the first and second flexural devices located on one side of the movable element the micromachined device additionally comprises a second constraining element extending between the floating beams of the first and second flexural devices located on the other side of the movable element, the second constraining element having a low compliance in the direction of travel and a high compliance in the orthogonal direction.

* * * * *